United States Patent [19]

Plass

[11] Patent Number: 4,901,279
[45] Date of Patent: Feb. 13, 1990

[54] MESFET SRAM WITH POWER SAVING CURRENT-LIMITING TRANSISTORS

[75] Inventor: Donald W. Plass, Pleasant Valley, N.Y.

[73] Assignee: International Business Machines Corporation, Armonk, N.Y.

[21] Appl. No.: 208,719

[22] Filed: Jun. 20, 1988

[51] Int. Cl.[4] .................. G11C 11/40; G11C 7/00
[52] U.S. Cl. .................. 365/154; 365/227; 365/182; 365/190; 307/446
[58] Field of Search ............... 365/154, 156, 185, 190, 365/227, 182; 307/279, 446

[56] References Cited

U.S. PATENT DOCUMENTS

| | | | |
|---|---|---|---|
| 3,810,128 | 5/1974 | Moser | 340/173 R |
| 4,375,677 | 3/1983 | Schuermeyer | 365/154 |
| 4,450,462 | 5/1984 | Nuyen | 357/16 |
| 4,458,338 | 7/1984 | Giebel et al. | 365/201 |
| 4,460,978 | 7/1984 | Jiang et al. | 365/185 |
| 4,503,522 | 3/1985 | Kawajiri et al. | 365/203 |
| 4,507,758 | 3/1985 | Moeschwitzer | 365/182 |
| 4,520,462 | 5/1985 | Yamada et al. | 365/189 |
| 4,567,577 | 1/1986 | Oliver | 365/156 |
| 4,577,215 | 3/1986 | Stewart | 357/23.5 |
| 4,578,778 | 3/1986 | Aoyama | 365/154 |

FOREIGN PATENT DOCUMENTS

| | | | |
|---|---|---|---|
| 54-48131 | 4/1979 | Japan | 365/154 |
| 54-122941 | 9/1979 | Japan | 365/154 |

*Primary Examiner*—Stuart N. Hecker
*Assistant Examiner*—Alfonso Garcia
*Attorney, Agent, or Firm*—Jeffrey L. Brandt

[57] ABSTRACT

A static random access memory cell implemented with metal Schottky field-effect transistors. The cell has first and second branches, each of the branches including: a depletion mode current limiting transistor having a drain connected to a first circuit node; a depletion mode load transistor having a drain connected to the source of the current limiting transistor and a source connected to a second circuit node; an enhancement mode active transistor having a drain connected to the second circuit node and a source connected to a third circuit node; an enhancement mode access transistor having a source connected to the second circuit node and a gate connected to the gate of the current limiting transistor; the gate of the load transistor connected to the second circuit node; the commonly connected gates of the current limiting transistor and the access transistor adapted to receive a word-line signal; and the drain of the access transistor adapted to receive a bit-line signal. The first circuit node is adapted for connection to a source of bias voltage, and the third circuit node is adapted for connection to a circuit ground. The first and second branches are cross-connected between the second nodes and the gates of the active transistors.

7 Claims, 2 Drawing Sheets

FIG.1
(PRIOR ART)
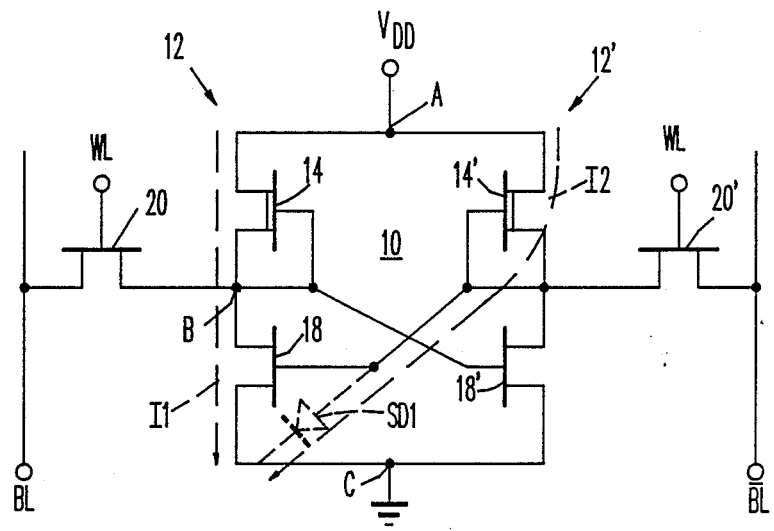
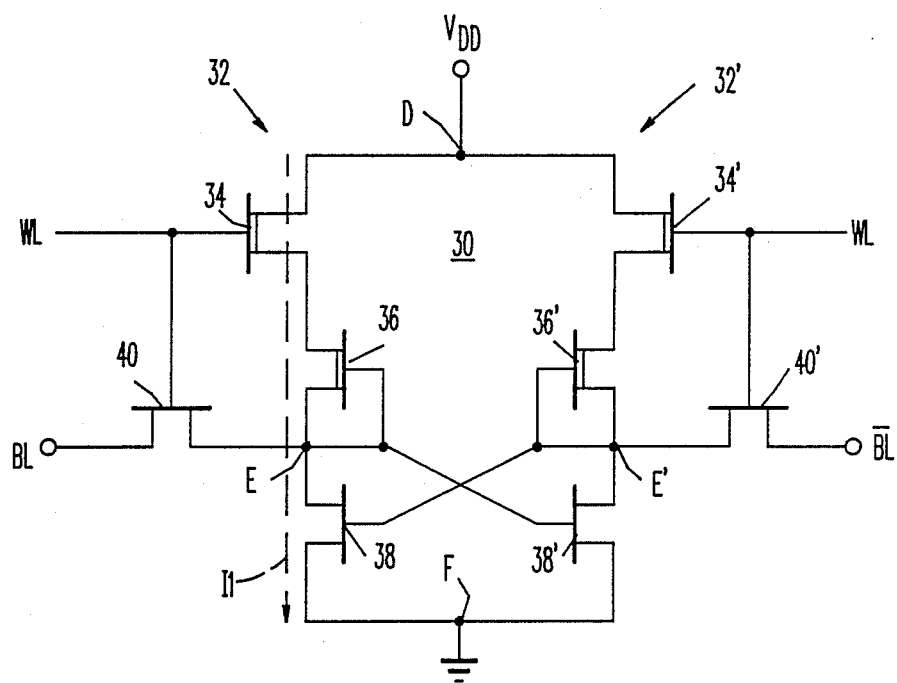
FIG.2

MESFET SRAM WITH POWER SAVING CURRENT-LIMITING TRANSISTORS

TECHNICAL FIELD OF THE INVENTION

The present invention relates generally to static random access memory (RAM) cells, and more specifically to such cells implemented with enhancement/depletion mode metal Schottky field-effect transistors (MESFETs) and exhibiting decreased standby current consumption.

BACKGROUND OF THE INVENTION

Referring to FIG. 1, a conventional, six transistor static RAM cell 10 is shown constructed from Gallium Arsenide (GaAs), MESFETS. Cell 10 comprises two identical, generally parallel, cross-coupled branches indicated at 12, 12'. For purposes of explanation, identical elements in each branch will be indicated with identical reference numerals, the numerals of the elements in the right branch being primed.

Describing now the structure of branch 12, a depletion mode load transistor, indicated at 14, is connected with its drain-source path in series between a pair of nodes A, B, and with its gate connected to circuit node B. Node A is adapted, for example through the use of appropriate metallization, for connection to a source of drain bias potential indicated as VDD An enhancement mode active transistor 18 is connected with its drain-source path in series between circuit node B and a circuit node C, the latter circuit node being adapted for connection to a circuit ground. An access transistor 20 is connected at its source to circuit node B, its drain functioning to receive the bit-line signal (BL), and its gate functioning to receive the word-line signal (WL).

Branches 12, 12' are connected at the drains of load transistors 14, 14' to circuit node A and at the sources of active transistors 18, 18' to circuit node B. Branches 12, 12' are further cross-connected between nodes B, B.' and the gates of transistors 18', 8, respectively.

In operation, transistors 14, 14', 18, 18' function in a well known manner as a bistable flip-flop, controlled by word line signal WL, to read or write complementary voltage levels utilizing bit-line signals BL, BL.-bar.

A disadvantage of above described cell 10 is that of high current consumption when word-line signal WL is not enabled (i.e. when word-line signal WL is logically low and cell 10 is in the standby mode of operation). For purposes of explaining this undesirable current consumption, it is necessary for the reader to understand that the gate-source junction of a MESFET device functions as a Schottky diode. Of particular interest with respect to the operation of cell 10 is the Schottky diode formed between the gate of active transistor 18 and circuit node C, the diode being indicated in phantom at SD1.

Continuing to explain the undesirable current consumption of cell 10 in the standby mode of operation, it will be assumed for purposes of explanation that word-line signal WL nd bit-line signals BL, BL-bar have been activated, in a conventional manner, to turn active transistor 18 on, and active transistor 18' off. This status causes a low side load current I1 to flow through branch 12. The gate of active transistor 18 is biased at a voltage level determined by the clamping action of Schottky diode SD1, and a second, high side load current I2 flows along the indicated path through branch 12' and Schottky diode SD1. This load current I2 constitutes the undesirable current component present in the standby mode of operation.

SUMMARY OF THE INVENTION

The principle object of the present invention is to provide a static RAM cell constructed of MESFETs which consumes less power than prior art devices.

A further object of the invention is to provide such a static RAM cell which requires no additional area on an integrated circuit, and no additional bias or control lines, in comparison to prior art devices.

A new and improved static random access memory cell is provided implemented with metal Schottky field-effect transistors. The cell includes first and second parallel branches, each of the branches comprising: a first circuit node adapted for connection to a source of bias voltage; a load transistor having a source connected to a second circuit node; an active transistor having a drain connected to the second circuit node and a source connected to a third circuit node; an access transistor having a source connected to the second circuit node; the gate of the load transistor connected to the second circuit node; the gate of the access transistor adapted to receive a cell word-line signal; the drain of the access transistor adapted to receive a cellbit-line signal; and the third circuit node adapted for connection to a ground potential. The first and second branches are cross-connected between the second nodes and the gates of the active transistors. Current limiting apparatus is provided in each of the branches, this current limiting apparatus comprising: current limiting means connected intermediate the first circuit node and the drain of the load transistor for reducing the drain current of the load transistor when the word line signal is not enabled; and means for applying the word line signal to the current limiting means.

In one embodiment of the invention, the current limiting means includes a current limiting transistor having a drain connected to the first circuit node and a source connected to the drain of the load transistor. The word line signal applying means comprises an electrical conductor connected between the gate of the access transistor and the gate of the current limiting transistor.

BRIEF DESCRIPTION OF THE DRAWINGS

The foregoing and other objects, features, and advantages of the invention will be apparent from the following more particular description of the invention as illustrated in the accompanying drawings, in which:

FIG. 1 is a circuit diagram of a static RAM cell constructed in accordance with the prior art as described hereinabove;

FIG. 2 is a circuit diagram of a static RAM cell constructed in accordance with the present invention;

DETAILED DESCRIPTION OF THE INVENTION

Figure 3:
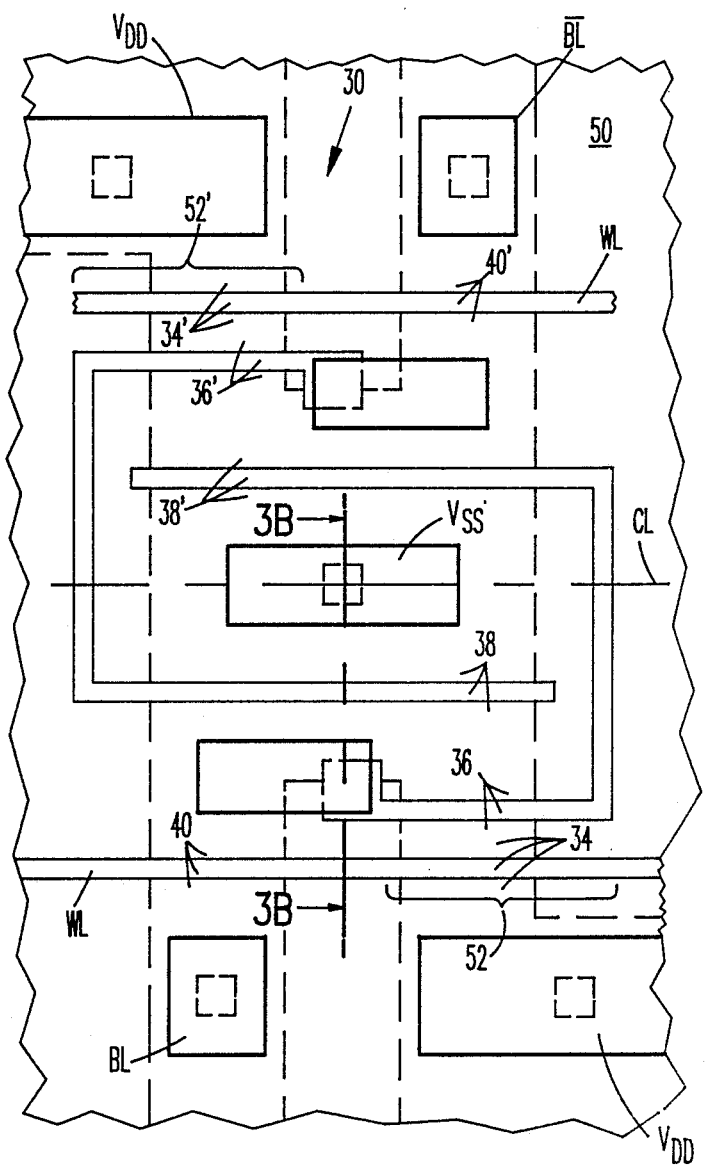
FIG. 3 is a schematic top view of the memory cell of FIG. 2 fabricated on a single integrated circuit in accordance with the present invention.

Referring now to FIG. 2, a static RAM cell 30 is shown constructed from GaAs MESFETS in accordance with the present invention. Cell 10 comprises two identical, generally parallel, cross-coupled branches indicated at 32, 32'. For purposes of explanation, identical elements in the right and left branches are indicated by identical reference numerals, with those elements in the right branch being primed.

Describing now the structure of branch 32, a depletion mode current limiting transistor 34 is connected at its drain to a circuit node D. A load transistor 36 has its drain connected to the source of current limiting transistor 34, and its gate and source connected to a circuit node E. Node D is adapted, for example through the use of appropriate metallization, for connection to a source of drain bias voltage indicated as $V_{DD}$. An enhancement mode active transistor 38 is connected with its drain-source path in series between circuit node E and a circuit node F, the latter circuit node being adapted for connection to a circuit ground or reference potential. An access transistor 40 is connected at its source to circuit node E, and at its gate to the gate of current limiting transistor 34. The drain of access transistor 40 functions to receive the bit-line signal BL, while the commonly connected gates of transistors 34 and 40 function to receive word-line signal WL.

Branches 32, 32' are connected at the drains of load transistors 34, 34' to circuit node D, and at the sources of active transistors 38, 38' to circuit node F. Branches 32, 32' are cross-connected between nodes E, E', and the gates of transistors 38', 38, respectively.

The operation of cell 30 will now be described, in a manner similar to the operation of cell 10 of FIG. 1 above, with transistor 38 turned on, and transistor 38' turned off.

It will be appreciated that current limiting transistor 34' comprises a depletion mode transistor having a threshold voltage similar in magnitude to the clamping voltage of the Schottky diode (not shown in FIG. 2) across the gate-source junction of active transistor 38. Thus, when cell 30 is in the standby mode of operation with word-line signal WL at a 0 volt level, transistor 34' is in a "soft" on state. That is, transistor 34' will conduct a relatively low current in its drain-source path. The voltage level at the source of current limiting transistor 34' will be slightly lower than the voltage level at the drain, due to the small voltage drop across the channel associated with the low current flow. The current available at the gate of active transistor 38 is thus well below the current at the normal clamping voltage of the gate-source diode, while the voltage level at the gate is somewhat reduced but sufficient to maintain cell 30 in a stable, standby operation state.

Thus, in cell 30 constructed in accordance with the present invention, load current I2 (FIG. 1) is greatly reduced in the standby mode of operation. If word-line signal WL is enabled (i.e. switched to a high logic level), current limiting transistor 34' is turned on "harder", and the voltage at circuit node E' rises to a normal Schottky clamping voltage so as to provide maximum gate drive current to active transistor 38. Of course, it will be understood that the operation of cell 30 is identical but opposite when the on/off status of the active transistor 38, 38' is reversed.

In addition to inhibiting the flow of high side current I2 (FIG. 1) in the standby mode of operation, current limiting transistor 34 functions to reduce the drain-source potential of load transistor 36, thereby also reducing the magnitude of low side load current I1 (FIG. 1) in the standby mode of operation. With cell 30 constructed in accordance with the present invention, in the standby mode of operation it is estimated to consume approximately 50 percent less total current than prior art cell 10 of FIG. 1.

Figure 3B:
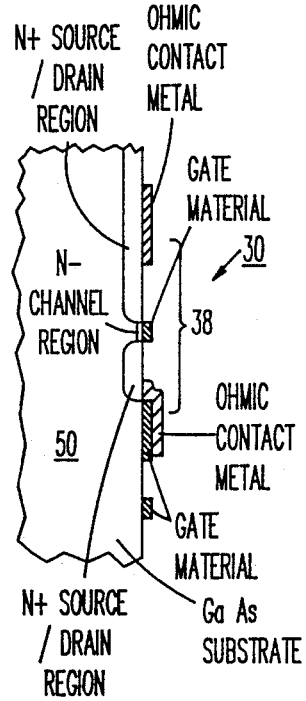
FIG. 3B. a sectional view taken along line 3B—3B of FIG. 3.
Figure 3A:
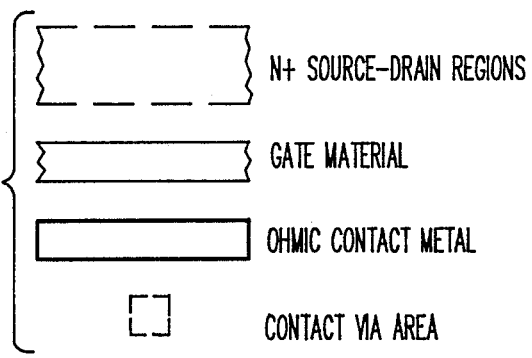
FIG. 3A shows legends defining the regions of the integrated FIG. 3.

Referring now to FIGS. 3, 3A, and 3B, cell 30 is shown fabricated on an integrated circuit chip 50. The preferred fabrication shown is a symmetrical, split word-line configuration, i.e. a flipped mirror image about a centerline CL including word-line signal connections WL at opposite ends of cell 30. The various regions in integrated circuit 50 which define the transistors of cell 30 are indicated by the same reference numerals used in FIG. 2, and the connections for receiving the word- and bit-line signals and bias voltage are likewise identically indicated. Gate material and ohmic contact metal are indicated with legends (FIGS. 3, 3A) and reference arrow (FIG. 3B). Doped drain/source regions are visible in FIGS. 3, 3B, and one exemplary doped channel region (i.e. the channel region of transistor 38) is visible under gate material in FIG. 3B. Source bias voltage $V_{SS}$ of FIG. 3 comprises the circuit ground of FIG. 2.

As is apparent from a consideration of FIG. 3, depletion mode current limiting transistor 34 is formed by extending word line WL into an area 52 overlying the portion of the N+ source/drain region leading to a $V_{DD}$ connection. Depletion mode current limiting transistor 34' is likewise formed on the opposite side of cell 30 by extending word line WL into a region 52'.

It will be appreciated that, because the $N^{30}$ region-to-$V_{DD}$ connection is necessary in the configuration of FIG. 3 regardless of the presence of current limiting transistors 34, 34', these active current limiting transistors are fabricated without increasing the area of cell 30 on integrated circuit 50. In fact, avoiding the forming of current limiting transistors 34, 34' (which would be parasitic if formed unintentionally) would require extra $V_{DD}$ or WL contacts which would enlarge cell. Thus, cell 30, constructed in accordance with the present invention, can be fabricated on a smaller area of integrated circuit 50 than that required to form a similarly configured prior art cell 10 (FIG. 1).

There is thus provided a new and improved static MESFET RAM cell having decreased current consumption in comparison to prior art devices. The cell can be fabricated in an identical or smaller area on an integrated circuit than prior art cells. The cell has particular application in large, static RAM circuits.

While the present invention has been described with respect to particular embodiment, it will be understood that the invention is not so limited. For example, although shown implemented with GaAs MESFETs, the present invention has application in MESFET RAM cells of the type shown fabricated from other semiconductor materials, including class III–V compounds. It will thus be understood by those skilled in the art that various changes in form and scope of the described embodiment may be made without departing from the spirit and scope of the invention.

I claim:

1. In a static random access memory cell implemented with metal Schottky field-effect transistors, said cell including first and second branches, each of said branches comprising a first circuit node adapted for connection to a source of bias potential, a load transistor having a source and gate connected to a second circuit node, an active transistor having a drain connected to said second circuit node and a source connected to a third circuit node, an access transistor having a source connected to said second circuit node, the gate of said access transistor adapted to receive a cell word-line signal, the drain of said access transistor adapted to receive a cell bit-line signal, and said third circuit node adapted for connection to a reference potential, said first and second branches cross-connected between said second nodes and the gates of said active transistors, current limiting apparatus in each of said branches comprising:

current limiting means connected intermediate said first circuit node and said drain of said load transistor for reducing the drain current of said load transistor when said word line signal is not enabled; and means for applying said word-line signal to said current limiting means.

2. Current limiting apparatus in accordance with claim 1 wherein:

said current limiting means includes a current limiting transistor having a drain connected to said first circuit node and a source connected to said drain of said load transistor; and said word-line signal applying means comprises an electrical conductor connected between said gate of said access transistor and the gate of said current limiting transistor.

3. A static random access memory cell implemented with metal Schottky field-effect transistors, said cell adapted for connection to a source of bias voltage and a reference potential, said cell responsive to a word-line signal and complimentary bit-line signals for storing complimentary voltage levels, said cell comprising:

first and second branches, each of said branches including a depletion mode current limiting transistor having a drain connected to a first circuit node, a depletion mode load transistor having a drain connected to the source of said current limiting transistor and a source and gate connected to a second circuit node, an enhancement mode active transistor having a drain connected to said second circuit node and a source connected to a third circuit node, an enhancement mode access transistor having a source connected to said second circuit node and a gate connected to the gate of said current limiting transistor, the commonly connected gates of said current limiting transistor and said access transistor adapted to receive said word-line signal, the drain of said access transistor adapted to receive a bit-line signal, said first circuit node adapted for connection to said source of bias voltage, and said third circuit node adapted for connection to said circuit reference potential; and said first and second branches cross-connected between said second nodes and the gates of said active transistors.

4. A cell in accordance with claim 3 wherein all of said transistors are fabricated from class III-V semiconductor materials.

5. A cell in accordance with claim 4 wherein all of said transistors comprise gallium arsenide (GaAs) metal Schottky field-effect transistors.

6. A cell in accordance with claim 3 wherein all of said transistors are fabricated on a single integrated circuit.

7. A cell in accordance with claim 6 wherein:

said integrated circuit is fabricated in a split word line configuration with word line connections on opposite sides of said circuit;

said current limiting and load transistors are positioned adjoining one-another in each of said branches on said integrated circuit; and the gates of said current limiting and access transistors in each of said first and second branches share a continuous region of metallization.

* * * * *

UNITED STATES PATENT AND TRADEMARK OFFICE
CERTIFICATE OF CORRECTION

PATENT NO. : 4,901,279

DATED : February 13, 1990

INVENTOR(S) : Donald W. Plass

It is certified that error appears in the above-identified patent and that said Letters Patent is hereby corrected as shown below:

Column 1, line 28, change "VDD" to --$V_{DD}$--.

Column 1, line 40, change "8" to --18--.

Column 4, line 29, change "$N^{30}$" to --$N^{+}$--.

Signed and Sealed this

Thirtieth Day of July, 1991

Attest:

HARRY F. MANBECK, JR.

*Attesting Officer*     Commissioner of Patents and Trademarks